(12) United States Patent
Cook (10) Patent No.: US 9,146,264 B2
(45) Date of Patent: Sep. 29, 2015

(54) CURRENT METER WITH ON BOARD MEMORY

(75) Inventor: Martin Cook, Tigard, OR (US)

(73) Assignee: Veris Industries, LLC, Portland, OR (US)

( * ) Notice: Subject to any disclaimer, the term of this patent is extended or adjusted under 35 U.S.C. 154(b) by 572 days.

(21) Appl. No.: 13/349,127

(22) Filed: Jan. 12, 2012

(65) Prior Publication Data

US 2012/0221278 A1    Aug. 30, 2012

Related U.S. Application Data

(60) Provisional application No. 61/446,911, filed on Feb. 25, 2011.

(51) Int. Cl.
| | |
|---|---|
| *G06F 19/00* | (2011.01) |
| *G01R 15/18* | (2006.01) |
| *G01R 21/133* | (2006.01) |
| G01R 1/02 | (2006.01) |
| G01R 22/06 | (2006.01) |
| G01R 19/165 | (2006.01) |
| G01R 19/25 | (2006.01) |
| G01R 35/04 | (2006.01) |
| G01R 15/14 | (2006.01) |

(52) U.S. Cl.
CPC ............. *G01R 21/133* (2013.01); *G01R 1/025* (2013.01); *G01R 15/14* (2013.01); *G01R 15/183* (2013.01); *G01R 19/16547* (2013.01); *G01R 19/2513* (2013.01); *G01R 22/068* (2013.01); *G01R 35/04* (2013.01)

(58) Field of Classification Search
CPC ...... G01R 21/133; G01R 35/04; G01R 15/14; G01R 19/2513; G01R 1/025; G01R 15/183; G01R 19/16547; G01R 22/068
USPC ................. 702/60, 107, 122; 324/127, 123 R, 324/140 R, 117 R, 126; 323/207, 210, 255
See application file for complete search history.

(56) References Cited

U.S. PATENT DOCUMENTS

| | | | |
|---|---|---|---|
| 1,100,171 | A | 6/1914 | Brown |
| 1,455,263 | A | 5/1923 | Oberfell |
| 1,569,723 | A | 1/1926 | Dickinson |
| 1,800,474 | A | 4/1931 | Scherer |
| 1,830,541 | A | 11/1931 | Harris |
| 1,871,710 | A | 8/1932 | Lenehan |

(Continued)

FOREIGN PATENT DOCUMENTS

| | | |
|---|---|---|
| EP | 1531334 A2 | 5/2005 |
| JP | 5083776 | 4/1993 |

OTHER PUBLICATIONS

AT91M42800A Summary, "AT91 ARM Thumb Microcontrollers," Atmel, Feb. 2002.

(Continued)

*Primary Examiner* — Carol S Tsai
(74) *Attorney, Agent, or Firm* — Chernoff Vilhauer McClung & Stenzel, LLP (57) ABSTRACT

The accuracy and flexibility of a branch circuit monitor is improved by storing specifications, including error correction factors, for a plurality of current transformers in the monitor's memory and enabling current transformers with stored specifications to be selected for use with the monitor.

12 Claims, 9 Drawing Sheets

(56) References Cited

U.S. PATENT DOCUMENTS

| | | |
|---|---|---|
| 2,059,594 A | 11/1936 | Massa, Jr. |
| 2,411,405 A | 11/1946 | Yuhas |
| 2,412,782 A | 12/1946 | Palmer |
| 2,428,613 A | 10/1947 | Boyajian |
| 2,428,784 A | 10/1947 | Cole |
| 2,512,070 A | 6/1950 | Nelson et al. |
| 2,663,190 A | 12/1953 | Ilgenfritz |
| 2,746,295 A | 5/1956 | Lubkin |
| 2,802,182 A | 8/1957 | Godshalk et al. |
| 2,852,739 A | 9/1958 | Hansen |
| 2,943,488 A | 7/1960 | Strobel at al. |
| 3,190,122 A | 6/1965 | Edwards |
| 3,243,674 A | 3/1966 | Ebert |
| 3,287,974 A | 11/1966 | Ciemochowski |
| 3,374,434 A | 3/1968 | Perry |
| 3,493,760 A | 2/1970 | Hoadley |
| 3,512,045 A | 5/1970 | Sanger at al. |
| 3,584,294 A | 6/1971 | Siwko |
| 3,593,078 A | 7/1971 | Domshy et al. |
| 3,696,288 A | 10/1972 | Carman |
| 3,728,705 A | 4/1973 | Atkins |
| 3,769,548 A | 10/1973 | Pardue |
| 3,772,625 A | 11/1973 | Raupach |
| 3,861,411 A | 1/1975 | Mitchell et al. |
| 3,955,701 A | 5/1976 | Fisch |
| 3,976,924 A | 8/1976 | Vanjani |
| 4,001,647 A | 1/1977 | Klein et al. |
| 4,001,758 A | 1/1977 | Esper et al. |
| 4,007,401 A | 2/1977 | Kimmel et al. |
| 4,030,058 A | 6/1977 | Riffe et al. |
| 4,048,605 A | 9/1977 | McCollum |
| 4,096,436 A | 6/1978 | Cook et al. |
| 4,107,519 A | 8/1978 | Bicek |
| D249,883 S | 10/1978 | Collins |
| 4,124,030 A | 11/1978 | Roberts |
| 4,151,578 A | 4/1979 | Bell |
| 4,158,217 A | 6/1979 | Bell |
| 4,158,810 A | 6/1979 | Leskovar |
| 4,177,496 A | 12/1979 | Bell et al. |
| 4,198,595 A | 4/1980 | Milkovic |
| 4,207,604 A | 6/1980 | Bell |
| 4,215,278 A | 7/1980 | Barbier et al. |
| 4,227,419 A | 10/1980 | Park |
| 4,241,237 A | 12/1980 | Paraskevakos et al. |
| 4,249,264 A | 2/1981 | Crochet et al. |
| 4,250,449 A | 2/1981 | Shum |
| 4,253,336 A | 3/1981 | Pietzuch |
| 4,258,348 A | 3/1981 | Belfer et al. |
| 4,297,741 A | 10/1981 | Howell |
| 4,328,903 A | 5/1982 | Baars |
| 4,354,155 A | 10/1982 | Speidel et al. |
| 4,359,672 A | 11/1982 | Hart |
| 4,362,580 A | 12/1982 | Kane et al. |
| 4,363,061 A | 12/1982 | Vaerewyck et al. |
| 4,371,814 A | 2/1983 | Hannas |
| 4,373,392 A | 2/1983 | Nagamoto |
| 4,384,289 A | 5/1983 | Stillwell et al. |
| 4,386,280 A | 5/1983 | Ricaud et al. |
| 4,388,668 A | 6/1983 | Bell et al. |
| 4,393,714 A | 7/1983 | Schmidt |
| 4,398,426 A | 8/1983 | Park et al. |
| 4,408,175 A | 10/1983 | Nelson et al. |
| 4,413,193 A | 11/1983 | Crockett |
| 4,413,230 A | 11/1983 | Miller |
| 4,426,673 A | 1/1984 | Bell et al. |
| 4,432,238 A | 2/1984 | Tward |
| 4,491,790 A | 1/1985 | Miller |
| 4,492,919 A | 1/1985 | Mikovic |
| 4,495,463 A | 1/1985 | Milkovic |
| 4,506,199 A | 3/1985 | Asche |
| 4,558,310 A | 12/1985 | McAllise |
| 4,558,595 A | 12/1985 | Kompelien |
| 4,574,266 A | 3/1986 | Valentine |
| 4,605,883 A | 8/1986 | Cockroft |
| 4,621,532 A | 11/1986 | Takagi et al. |
| 4,660,407 A | 4/1987 | Takami et al. |
| 4,709,339 A | 11/1987 | Fernandes |
| 4,739,229 A | 4/1988 | Heiler, Jr. |
| 4,746,809 A | 5/1988 | Coleman et al. |
| 4,754,365 A | 6/1988 | Kazahaya |
| 4,757,416 A | 7/1988 | Wilkerson |
| 4,758,774 A | 7/1988 | Crawford et al. |
| 4,758,962 A | 7/1988 | Fernandes |
| 4,783,748 A | 11/1988 | Swarztrauber et al. |
| 4,794,327 A | 12/1988 | Fernandes |
| 4,808,910 A | 2/1989 | Kessi |
| D301,331 S | 5/1989 | Rhodin |
| 4,851,803 A | 7/1989 | Hahn |
| 4,855,671 A | 8/1989 | Fernandes |
| 4,874,904 A | 10/1989 | DeSanti |
| 4,885,655 A | 12/1989 | Springer et al. |
| 4,887,018 A | 12/1989 | Libert |
| 4,890,318 A | 12/1989 | Crane et al. |
| 4,926,105 A | 5/1990 | Mischenko et al. |
| 4,939,451 A | 7/1990 | Baran et al. |
| 4,944,187 A | 7/1990 | Frick et al. |
| 4,956,588 A | 9/1990 | Ming |
| 4,970,476 A | 11/1990 | Kitagawa |
| 4,972,167 A | 11/1990 | Fujioka |
| 4,991,050 A | 2/1991 | Heberlein, Jr. et al. |
| 4,992,709 A | 2/1991 | Griffin |
| 4,999,575 A | 3/1991 | Germer |
| 5,003,278 A | 3/1991 | May |
| 5,006,846 A | 4/1991 | Granville |
| 5,014,908 A | 5/1991 | Cox |
| 5,039,970 A | 8/1991 | Cox |
| 5,051,601 A | 9/1991 | Atobe et al. |
| 5,066,904 A | 11/1991 | Bullock |
| 5,079,510 A | 1/1992 | Komatsu et al. |
| D323,815 S | 2/1992 | Boutellier |
| 5,099,193 A | 3/1992 | Moseley et al. |
| 5,122,735 A | 6/1992 | Porter et al. |
| 5,148,348 A | 9/1992 | White |
| 5,181,026 A | 1/1993 | Granville |
| 5,196,784 A | 3/1993 | Estes, Jr. |
| D335,488 S | 5/1993 | Suzuki et al. |
| 5,223,790 A | 6/1993 | Baran et al. |
| 5,249,231 A | 9/1993 | Covey et al. |
| 5,267,122 A | 11/1993 | Glover et al. |
| 5,296,819 A | 3/1994 | Kuroiwa et al. |
| 5,311,138 A | 5/1994 | Ott et al. |
| 5,317,274 A | 5/1994 | Nakagawa et al. |
| 5,323,256 A | 6/1994 | Banks |
| 5,337,206 A | 8/1994 | Kadah et al. |
| 5,359,273 A | 10/1994 | Fluckiger |
| 5,365,462 A | 11/1994 | McBean |
| 5,377,128 A | 12/1994 | McBean |
| D354,945 S | 1/1995 | Dellavecchia et al. |
| 5,385,060 A | 1/1995 | Wang |
| 5,391,983 A | 2/1995 | Lusignan et al. |
| 5,397,970 A | 3/1995 | Rowlette et al. |
| 5,410,920 A | 5/1995 | Westwick |
| 5,426,360 A | 6/1995 | Maraio et al. |
| 5,426,579 A * | 6/1995 | Paul et al. .................... 363/126 |
| 5,430,438 A | 7/1995 | Joos et al. |
| 5,444,183 A | 8/1995 | Gehrs et al. |
| 5,450,765 A | 9/1995 | Stover |
| 5,467,012 A | 11/1995 | Nystrom |
| 5,471,359 A | 11/1995 | Simpson et al. |
| 5,473,234 A | 12/1995 | Richardson |
| 5,502,374 A | 3/1996 | Cota |
| 5,548,209 A | 8/1996 | Lusignan et al. |
| 5,563,506 A | 10/1996 | Fielden et al. |
| 5,572,073 A | 11/1996 | Burgess et al. |
| 5,578,927 A | 11/1996 | Perelle |
| 5,592,989 A | 1/1997 | Lynn et al. |
| 5,596,652 A | 1/1997 | Piatek et al. |
| 5,604,315 A | 2/1997 | Briefer et al. |
| 5,612,499 A | 3/1997 | Andrew et al. |
| 5,677,476 A | 10/1997 | McCarthy et al. |
| 5,705,989 A | 1/1998 | Cota et al. |
| 5,712,558 A | 1/1998 | Saint-Cyr et al. |
| 5,753,983 A | 5/1998 | Dickie et al. |
| 5,784,249 A | 7/1998 | Pouliot |

(56) References Cited

U.S. PATENT DOCUMENTS

| | | | |
|---|---|---|---|
| 5,808,846 A | 9/1998 | Holce et al. |
| 5,844,138 A | 12/1998 | Cota |
| 5,861,683 A | 1/1999 | Engel et al. |
| 5,880,677 A | 3/1999 | Lestician |
| 5,880,918 A | 3/1999 | Horbelt et al. |
| 5,905,439 A | 5/1999 | McIntyre |
| 5,909,087 A | 6/1999 | Bryde et al. |
| 5,920,190 A | 7/1999 | Peterson et al. |
| 5,920,191 A | 7/1999 | Maniero et al. |
| 5,922,939 A | 7/1999 | Cota |
| 5,994,892 A | 11/1999 | Turino et al. |
| 5,995,911 A | 11/1999 | Hart |
| 6,005,760 A | 12/1999 | Holce et al. |
| D419,964 S | 2/2000 | Holce et al. |
| 6,020,702 A | 2/2000 | Farr |
| 6,029,524 A | 2/2000 | Klauder et al. |
| 6,044,430 A | 3/2000 | MacDonald |
| 6,046,550 A | 4/2000 | Ference et al. |
| 6,064,192 A | 5/2000 | Redmyer |
| 6,091,023 A | 7/2000 | O'Donnell |
| 6,122,972 A | 9/2000 | Crider |
| 6,124,791 A | 9/2000 | Wolf |
| D431,534 S | 10/2000 | Holce et al. |
| 6,133,709 A | 10/2000 | Puchianu |
| 6,133,723 A | 10/2000 | Feight |
| 6,137,418 A | 10/2000 | Zuercher et al. |
| 6,146,109 A | 11/2000 | Davis et al. |
| 6,219,216 B1 | 4/2001 | Holce et al. |
| 6,236,949 B1 | 5/2001 | Hart |
| 6,269,317 B1 | 7/2001 | Schachner et al. |
| 6,308,140 B1 | 10/2001 | Dowling et al. |
| 6,330,516 B1 * | 12/2001 | Kammeter | 702/60 |
| 6,331,821 B1 | 12/2001 | Holce et al. |
| 6,344,951 B1 | 2/2002 | Sato et al. |
| 6,351,206 B1 | 2/2002 | Schweiger et al. |
| 6,373,238 B2 | 4/2002 | Lewis et al. |
| 6,377,430 B2 | 4/2002 | Holce et al. |
| 6,380,696 B1 | 4/2002 | Sembhi et al. |
| 6,384,946 B1 | 5/2002 | Pitsch et al. |
| 6,404,166 B1 | 6/2002 | Puchianu |
| 6,414,241 B1 | 7/2002 | O'Donnell |
| D466,078 S | 11/2002 | Bowman |
| 6,496,378 B2 | 12/2002 | Holce et al. |
| 6,504,357 B1 | 1/2003 | Hemminger et al. |
| 6,504,695 B1 | 1/2003 | Holce et al. |
| 6,549,859 B1 | 4/2003 | Ward |
| 6,591,482 B1 | 7/2003 | Fleege et al. |
| D478,313 S | 8/2003 | Bowman |
| 6,615,147 B1 | 9/2003 | Jonker et al. |
| 6,636,028 B2 | 10/2003 | Lavoie et al. |
| 6,657,424 B1 | 12/2003 | Voisine et al. |
| 6,724,600 B2 | 4/2004 | Holce et al. |
| 6,737,854 B2 | 5/2004 | Bruno et al. |
| 6,756,776 B2 | 6/2004 | Perkinson et al. |
| 6,774,803 B1 | 8/2004 | Tiffin |
| 6,809,509 B2 | 10/2004 | Bruno et al. |
| 6,815,942 B2 | 11/2004 | Randall et al. |
| 6,825,771 B2 | 11/2004 | Bruno et al. |
| 6,856,515 B2 | 2/2005 | Holce et al. |
| 6,861,683 B2 | 3/2005 | Rissing et al. |
| 6,871,827 B2 | 3/2005 | Petak et al. |
| 6,888,712 B2 | 5/2005 | Holce et al. |
| 6,889,271 B1 | 5/2005 | Germer et al. |
| 6,907,302 B2 * | 6/2005 | Karbassi | 700/65 |
| 6,937,003 B2 | 8/2005 | Bowman et al. |
| 6,950,292 B2 | 9/2005 | Holce et al. |
| 6,988,043 B1 | 1/2006 | Randall |
| 7,006,934 B2 | 2/2006 | Jonker et al. |
| 7,053,497 B2 | 5/2006 | Sodemann et al. |
| 7,157,899 B2 | 1/2007 | Bruno |
| 7,161,345 B2 | 1/2007 | Bruno |
| 7,174,261 B2 | 2/2007 | Gunn et al. |
| 7,193,428 B1 | 3/2007 | Baron et al. |
| 7,212,930 B2 | 5/2007 | Bruno |
| 7,221,145 B2 | 5/2007 | Bowman et al. |
| 7,230,414 B2 | 6/2007 | Bruno |
| 7,239,810 B2 | 7/2007 | Seely et al. |
| 7,274,187 B2 | 9/2007 | Loy |
| 7,282,889 B2 | 10/2007 | Freed et al. |
| 7,310,049 B2 | 12/2007 | Bowman |
| 7,312,686 B2 | 12/2007 | Bruno |
| 7,313,668 B2 | 12/2007 | Worley |
| 7,330,022 B2 | 2/2008 | Bowman et al. |
| 7,333,345 B2 | 2/2008 | Holce et al. |
| 7,352,287 B2 | 4/2008 | Rupert |
| 7,359,809 B2 | 4/2008 | Bruno |
| 7,362,232 B2 | 4/2008 | Holle et al. |
| 7,447,603 B2 | 11/2008 | Bruno |
| 7,474,088 B2 | 1/2009 | Bowman et al. |
| 8,116,916 B1 * | 2/2012 | Zeanah et al. | 700/291 |
| 8,212,548 B2 | 7/2012 | Parker et al. |
| 8,421,443 B2 * | 4/2013 | Bitsch et al. | 324/127 |
| 8,421,639 B2 * | 4/2013 | Bitsch et al. | 340/664 |
| 8,624,578 B2 * | 1/2014 | Rupert et al. | 324/76.77 |
| 2004/0183522 A1 | 9/2004 | Gunn et al. |
| 2004/0227503 A1 | 11/2004 | Bowman et al. |
| 2005/0240362 A1 | 10/2005 | Randall |
| 2006/0085144 A1 | 4/2006 | Slota et al. |
| 2006/0103548 A1 | 5/2006 | Borkowski et al. |
| 2006/0164096 A1 | 7/2006 | Kwon |
| 2006/0181242 A1 | 8/2006 | Freed et al. |
| 2009/0049222 A1 | 2/2009 | Lee et al. |
| 2009/0115400 A1 | 5/2009 | Hunter |
| 2009/0115620 A1 | 5/2009 | Hunter |
| 2010/0207604 A1 * | 8/2010 | Bitsch et al. | 324/140 R |
| 2010/0308792 A1 * | 12/2010 | Rupert et al. | 324/76.77 |
| 2011/0156698 A1 | 6/2011 | Cook |

OTHER PUBLICATIONS

Description of KT® 6300, 6400 Split-Core kW/kWH Transducers . . . Enercept KT®, 1 page By Hawkeye® (by Veris Industries, Inc.), at least one year prior to filing date (1997) (unavailable month).

Ganssie, "Interrupt Latency," Embedded.com, Article.. jhmtl?articleID=9900320, Aug. 26, 2004 <www.embedded.com/show>.

* cited by examiner

CURRENT METER WITH ON BOARD MEMORY

CROSS-REFERENCE TO RELATED APPLICATIONS

This application claims priority to Provisional App. No. 61/446,911, filed Feb. 25, 2011.

BACKGROUND OF THE INVENTION

The present invention relates a current monitoring system and, more particularly, to a user configurable branch circuit monitor with a memory for storing transducer characteristics.

The total power consumption of a building or other facility is typically monitored by the electric utility with a power meter located between the utility's distribution transformer and the facility's power distribution panel. However, in many instances it is desirable to sub-meter or attribute the facility's power usage and cost to different occupancies, buildings, departments, or cost centers within the facility or to monitor the power consumption of individual loads or groups of loads, such as motors, lighting, heating units, cooling units, etc. These single phase or multi-phase electrical loads are typically connected to one or more of the branch circuits that extend from the facility's power distribution panel. While a power meter may be installed at any location between a load and the distribution panel, typically a power meter capable of monitoring a plurality of circuits is installed proximate the power distribution panel to provide centralized monitoring of the various loads powered from the panel.

Flexibility has favored adoption of digital current and power meters, known as branch circuit monitors, incorporating data processing systems that can monitor a plurality of circuits and determine a number of parameters related to electricity consumption. A digital power meter for measuring electricity consumption by respective branch circuits comprises a plurality of voltage and current transducers that are periodically read by the meter's data processing unit which, in a typical digital power meter, comprises one or more microprocessors or digital signal processors (DSP). The data processing unit periodically reads and stores the outputs of the transducers sensing the magnitudes of the current and voltage and, using this sample data, calculates the current, voltage, power, and other electrical parameters, such as active power, apparent power and reactive power that quantify electricity distribution and consumption. The calculated parameters are typically output to a display for immediate viewing and/or transmitted from the meter's communications interface to another data processing system, such as a building management computer for remote display or further processing, for example formulating instructions to automated building equipment.

While the voltage transducer(s) of a digital power meter can be interconnected anywhere in the wiring that connects the supply and a load, including at the load's terminals, interconnection of voltage transducers and the facility's wiring is facilitated by wiring connections in the power distribution panel. The power distribution panel provides a convenient location for connecting the voltage transducers because typically each phase of the power is conducted by a separate bus bar in the power distribution panel and the voltage and phase is the same for all loads attached to the respective bus bar. The voltage transducers of digital power meters commonly comprise a voltage divider network that is connected to a conductor in which the voltage will be measured.

The current transducers of digital power meters typically comprise current transformers that encircle the respective power cables that interconnect each circuit to the bus bar(s) of the distribution panel. To measure the power consumed by the plurality of loads making up a facility, a current transformer must be installed in each branch circuit connecting the load(s) to the distribution panel. A current transformer typically comprises multiple turns of wire wrapped around the cross-section of a toroidal core. The power cable, conducting the load current, is passed through the aperture in the center of the toroidal core and constitutes the primary winding of the transformer and the wire wrapped around the cross-section of the core comprises the secondary winding of the transformer. Current flowing in the primary winding (primary current) induces a secondary voltage and current in the secondary winding which is quantitatively related to the current in the primary winding. The secondary winding is typically connected to a resistor network and the magnitude of the primary current can be determined from the amplitude of the voltage at the output of the resistor network.

Accurate measurement of electric power also requires compensation for error introduced by the transducers comprising the power meter. For example, the secondary current of a current transformer is ideally equal to the load current flowing in the power cable (the primary winding) divided by the number of turns in the secondary winding. However, magnetization of the core of the transformer produces ratio and phase errors which vary with the magnitude of the current being measured and the configuration of the particular transformer, including factors such as core material and turns ratio. Typically, a power meter is configured for use with a particular transducer and error compensation factors, ascertained by experimentation with sample transducers, are built into the meter and applied by the data processing unit during calculation of the meter's output.

However, a user may desire to use a different transducer than that specified for use with a particular meter or several different transducers may be required because of a wide variation in the magnitude of the current in the various branch circuits or it may be necessary to replace one or more transducers during use. Using transducers that are not matched to the meter results in inaccurate readings from the meter. What is desired, therefore, is a branch circuit monitor providing flexible construction, simplified installation and improved serviceability.

DETAILED DESCRIPTION OF PREFERRED EMBODIMENTS

Electricity delivered by the local utility to a facility's mains is distributed to the various loads in the facility by branch circuits which are conductively connected to the mains at a distribution panel. Referring in detail to the drawings where similar parts are identified by like reference numerals, and, more particularly to FIG. 1, an exemplary distribution panel 20 includes two three-phase mains 22A, 22B which are respectively connected to main circuit breakers 24A, 24B. Each of the phases of each main is connected to a respective bus bar 26A, 26B, 26C and 28A, 28B, 28C. Three of the bus bars extend behind each of two rows of branch circuit breakers 30 that respectively conductively connect one of the bus bars to a branch circuit conductor 32 which is conductively connected to the load(s) of the branch circuit. A single phase load, for example, load 34, is conductively connected to single bus bar. A two-phase load is connected, typically, through two adjacent circuit breakers in the same row, to two bus bars conducting different phases of the power. A three-phase load, for example, load 36, is connected, typically, through three adjacent circuit breakers in the same row, to three bus bars each conducting a different phase of the electricity.

Figure 1:
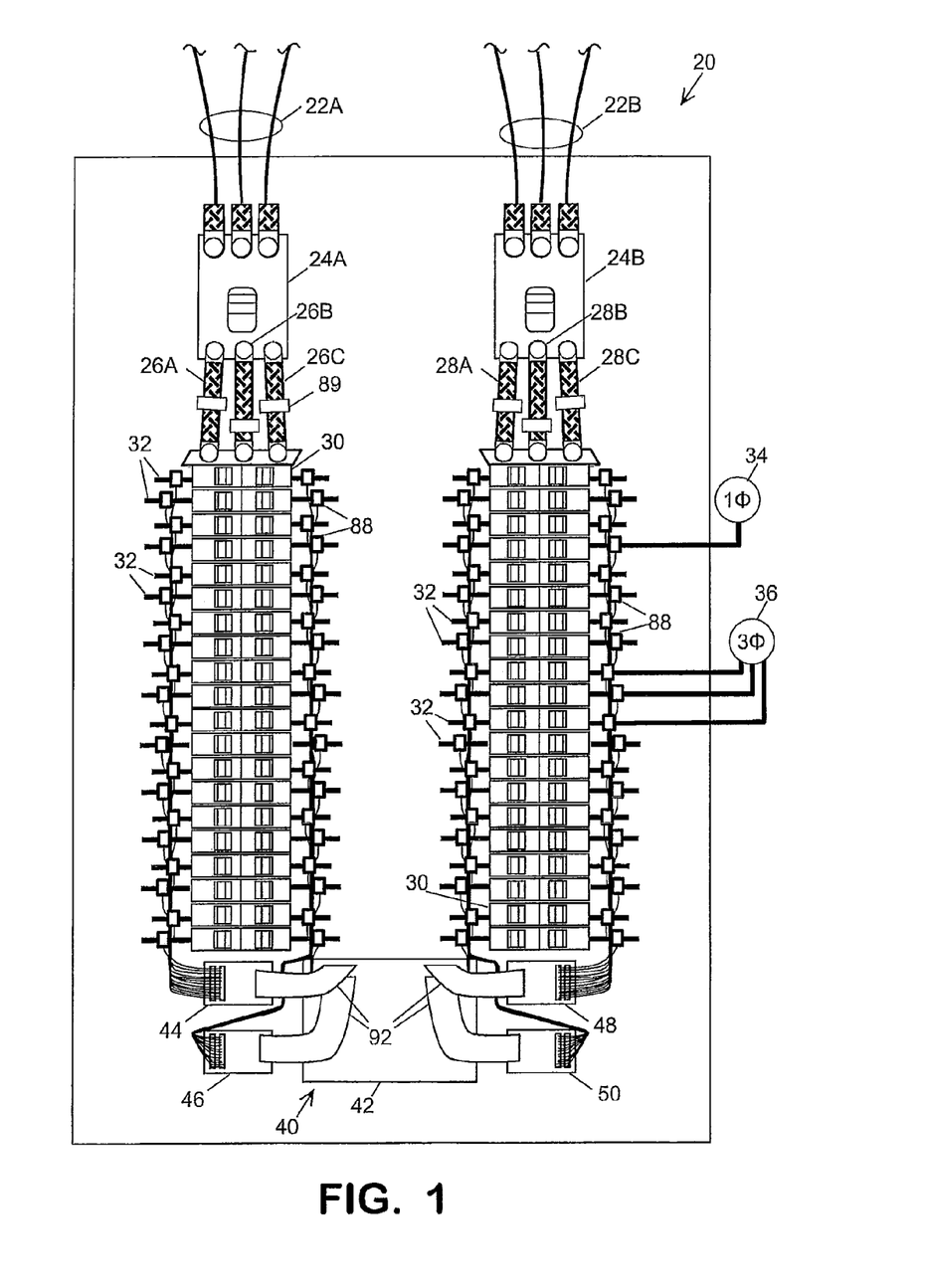
FIG. 1 is front view of an electric power distribution panel including a branch circuit monitor.

A digital branch circuit monitor 40 is often installed in an electrical distribution panel, such as the exemplary distribution panel 20, to monitor the current or the current and the voltage in the circuits served by the panel. For example, a digital branch circuit monitor produced by Veris Industries, Inc. can monitor the current or the power (current and voltage) in 84 branch circuit conductors and two three-phase mains of a power distribution panel and can determine, in addition to voltage and current, a number of other parameters related to energy consumption for each circuit served by the distribution panel. Data updates occur approximately every two seconds and an alarm may be triggered by the monitor if the operation of a circuit approaches a user configured threshold. The exemplary branch circuit monitor 40 comprises a main acquisition board 42 and four adapter boards 44, 46, 48, 50 facilitating interconnection of the measuring circuitry and the transducers which sense current and voltage in the various conductors of the distribution panel.

Figure 2:
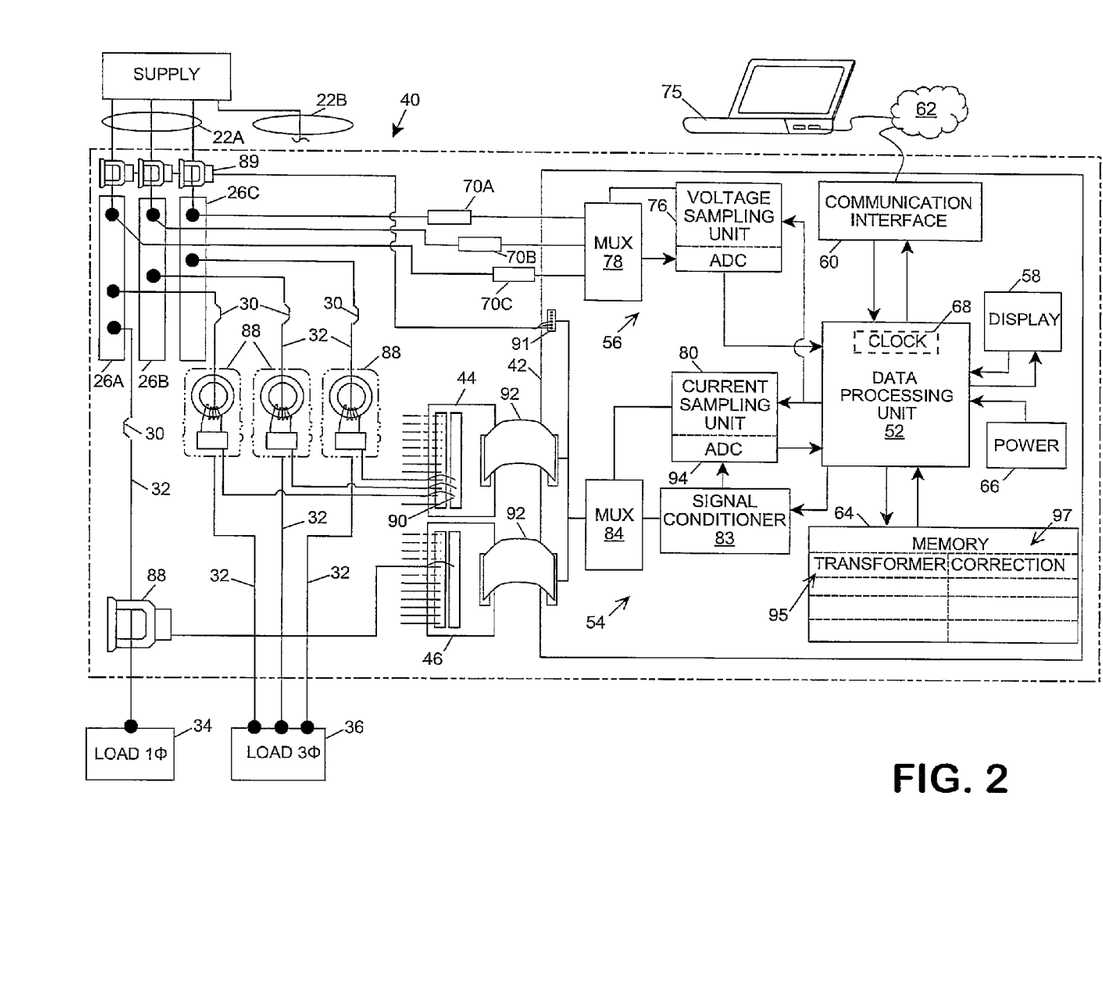
FIG. 2 is a schematic diagram of a branch circuit monitor.

Referring also to FIG. 2, the exemplary digital branch circuit monitor 40 is arranged to monitor the both voltage and current in a plurality of branch circuits and comprises, generally, a data processing unit 52, a current measuring section 54 and a voltage measuring section 56. The data processing unit 52 typically comprises at least one microprocessor or digital signal processor (DSP). The data processing unit 52 periodically reads and stores data from the voltage 56 and the current 54 measuring sections, and uses that data to calculate the current, voltage, power and other electrical parameters that are the meter's output. The calculated values may be output to a display 58 for viewing at the meter or output to a communications interface 60 for transmission via a communication network 62 to another data processing system 75, such as a building management computer, for remote display or use in automating or managing the facility's operations. A memory 64 in which the software for the data processing unit and data manipulated by the data processing unit may be stored is associated with the data processing unit. A power supply 66 provides power to the data processing unit and to the voltage and current measuring sections. One or more clocks 68, which may be incorporated into the data processing unit, time intervals between the occurrences of monitored events.

The voltage measuring section 56 includes one or more voltage transducers 70A, 70B, 70C each typically comprising a resistor network, a voltage sampling unit 76 to sample the output of the voltage transducers and convert the analog measurements to digital data suitable for use by the data processing unit and a multiplexer 78 that periodically connects the voltage sampling unit to a selected one of the voltage transducers enabling periodic sampling of the magnitude of the voltage at each voltage transducer. Typically, each phase of the electricity supplied to a distribution panel is connected to a bus bar, for example, bus bars 26A, 26B, 26C, and each branch circuit breaker 30 connectively interconnects one of the bus bars to a branch circuit conductor 32. One or more of the branch circuit conductors are conductively connected to each of the facility's loads, for examples, loads 34, 36. Since the voltage and phase supplied to all commonly connected loads is the same, a meter for measuring three-phase power typically includes at least three voltage transducers 70A, 70B, 70C each connected to one of the bus bars 26A, 26B, 26C that is conducting a different phase of the power from one of the mains, for example, main 22A.

The current measuring section 54 comprises a current sampling unit 80, a multiplexer 84, a signal conditioning unit 83 and a plurality of current transducers. The current transducers are preferably current transformers but other types of current sensors might be used. Current monitoring with a current transformer requires a current transformer for each of the conductors in which the current is to be monitored. In the exemplary branch circuit monitor 40 a current transformer 89 senses the current in each of the panel's mains and a branch current transducer 88 senses the current in each of the panel's branch circuit conductors 32.

The auxiliary current transformers 89 monitoring the current in the mains are connected to a terminal block 91 on the main circuit board. Each terminal of the terminal block 91 is conductively connected to the multiplexer 84. For convenience, each of the branch current transducers 88 may be respectively connected to a sensor position 90 on one of the adapter boards, 44, 46, 48, 50. A multi-conductor cable 92 communicatively connects each of the sensor positions of each of the adapter boards to the multiplexer 84 on the main circuit board 42. The multiplexer 84 is connected to a signal conditioning unit 83 which is, in turn, conductively connected to an analog-to-digital converter 94 of the current sampling unit 80. In response to a timing signal from the clock 68, the multiplexer sequentially connects each sensor position and each terminal block connection to the signal conditioning unit and, thereby, the analog-to-digital converter which outputs to the data processing unit 52 a digital signal representing a sample output of the respective current transducer. The data processing unit calculates the current in the power cable monitored by a current transducer from the characteristics of the transducer and a plurality of sample outputs of the transducer accumulated over a period of time.

Figure 3:
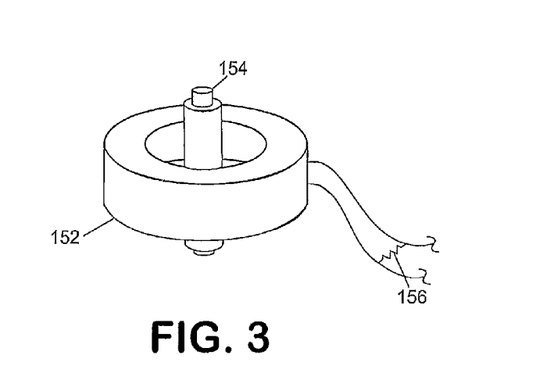
FIG. 3 is a perspective view of a solid core current transformer.
Figure 4:
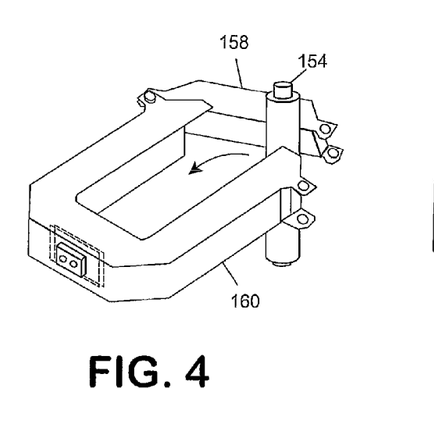
FIG. 4 is a perspective view of an open split core current transformer.
Figure 5:
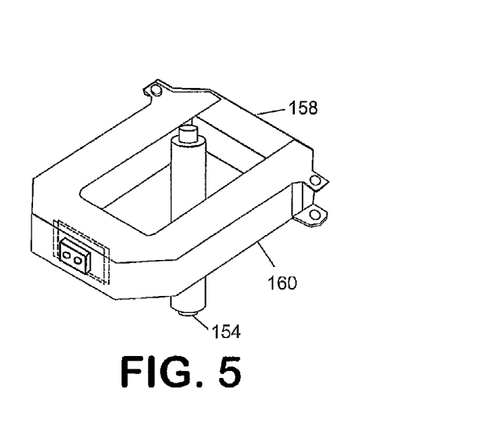
FIG. 5 is a perspective view of a closed split core current transformer.

Each current transformer comprises a coil of wire wound on the cross-section of a toroidal non-metallic or metallic core which is commonly enclosed in a plastic housing. Referring to FIGS. 3, 4, and 5, the conductor in which the current is to be measured, for example the conductor 154, is passed through the central aperture in the toroidal core. This conductor 154 is the primary winding of the transformer and current flowing in the conductor induces a secondary current and voltage in the secondary winding, the wire wrapped around the cross-section of the core. Referring to FIG. 3, current transformers may have a solid core 152 requiring that the conductor be disconnected for insertion into core's aperture. On the other hand referring to FIG. 4, current transformers may have a split core comprising two hinged or separable core portions 158, 160 enabling creation of a gap between the core portions for inserting the conductor 154 while it is still connected. Referring to FIG. 5, after the conductor 154 is positioned in the area of the core's central aperture, the core portions 158, 160 are joined, closing the gap, for operation. The sensed output of a current transformer may be the current in the secondary winding, typically, having a range of 4-20 milliamps (mA) or 0-5 Amps. On the other hand, the sensed output may be the voltage measured across a burden resistor 156 connected in parallel with the secondary winding. Typical voltage ranges for current transistors are 0-0.333 volts (v.), 0-5 v. or 0-10v. However, current transformers with other output current and voltage ranges are available.

Ideally, the secondary current of a current transformer is equal to the current in the primary winding, the conductor of the current that is to be measured, divided by turns ratio, the number of turns in the secondary winding divided by the number of turns in the primary winding which is often one. However, actual transformers are not ideal transformers and the magnetization of the core of a current transformer causes the primary current to be less than the product of the secondary current and the turns ratio. Accurate measurement of electric power requires compensation for error introduced by the transducers.

Figure 6:
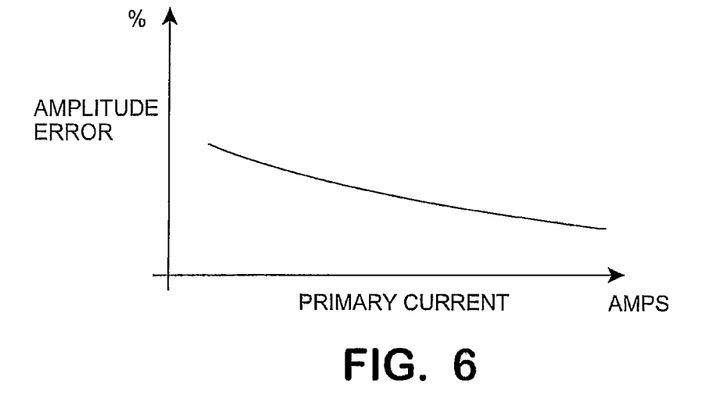
FIG. 6 is a graphical representation of a ratio error of a current transformer.

Current transformer error comprises a phase error and a ratio error. Referring to FIG. 6, the ratio error ($r_e$) varies with the magnitude of the primary current ($I_1$) as follows:

$$r_e(\%) = K_3 + K_4(\log I_1) \quad (1)$$

where $K_3$ and $K_4$ are constants.
The effect of the ratio error is to alter the relationship between the magnitudes of the measured secondary current ($I_2$) and the primary current ($I_1$) from the theoretical relationship, that is:

$$I_1 = I_2(n) \quad (2)$$

where n=turns ratio,
to the relationship:

$$I_1 = I_2'\left(n + \frac{nr_e}{100}\right) \quad (3)$$

where $I'_2$=measured secondary current
The magnitude of the measured secondary current ($I_2'$) is related to the theoretical secondary current ($I_2$), as follows:

$$I_2 = I_2'\left(1 + \frac{r_e}{100}\right) \quad (4)$$

Figure 7:
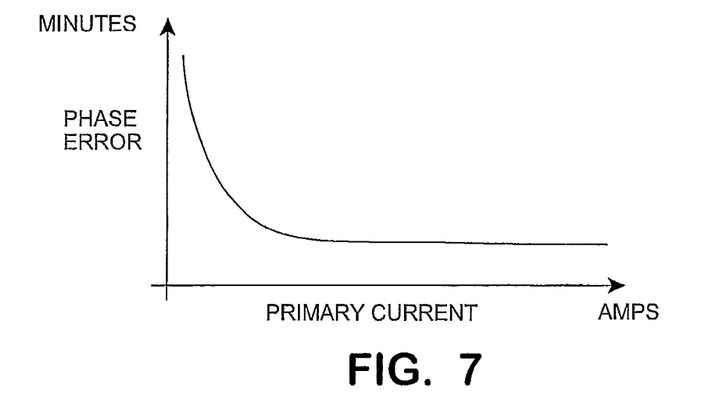
FIG. 7 is a graphical representation of a phase error of a current transformer.

Referring to FIG. 7, magnetization of the transformer core and windings also causes a phase shift between the current in the primary winding and the current in the secondary winding. The resulting phase error (P) varies with the magnitude of the primary current ($I_1$) approximately according to the relationship:

$$P = K_1 + K_2(I_1^{-M}) \quad (5)$$

where M, $K_1$ and $K_2$ are constants
In practice M is often approximately equal to ½ and, consequently, a square root approximation can often be conveniently employed as part of the overall correction algorithm.

The values of the constants $K_1$, $K_2$, $K_3$, and $K_4$ and, therefore, the magnitudes of the phase and ratio errors depend upon the configuration of the particular current transformer. Factors such as core material and turns ratio affect the values of the constants which are typically ascertained by experiment with samples of a given core configuration. Typically, the values of $K_1$, $K_2$, $K_3$, and $K_4$ are determined for a particular transformer configuration or production batch by comparing the actual performance of a sample of the transformer configuration to the performance of a standard device when the secondary winding is connected in parallel to a particular impedance or burden.

Typically, a branch circuit monitor is intended for operation with a particular current transformer and is designed to compensate for errors produced by the transformer. The accuracy of the branch circuit monitor suffers if the user elects to use a different current transformer with the meter. However, a user may desire to use current transformers other than those recommended by the meter's manufacturer to, for example, replace a damaged current transformer after installation or use existing current transformers when replacing another branch circuit monitor. The present inventor concluded that the flexibility and serviceability of a digital branch circuit monitor could be improved if the installer could customize the configuration of monitor for the current transformers chosen for use with the meter. The inventor concluded that if the installer was provided with a configuration tool that enabled access to the branch circuit monitor's memory, the installer could configure the monitor for use with current transformers having a wide range of specifications.

The branch circuit monitor configuration tool may be installed on the branch circuit monitor 40 or may be installed on another computer 75, typically, comprising a data processing unit to execute instructions; a memory for storing instructions and data utilized by the computer's data processing unit; one or more input devices, such as a keyboard and a mouse and/or touch pad; and a display. The computer 75 is communicatively connected, typically, either directly or via a communication network 62, such as the Internet, through the monitor's communication interface 60 to the data processing unit 52 of the branch circuit monitor 40. When the configuration tool is activated, instructions executed by the data processing unit of the branch circuit monitor or the remote computer 75 cause a series of templates to be displayed on the monitor's display 58 and/or the display of the remote computer 75 enabling an installer of the branch circuit monitor to enter and store in the branch circuit monitor's memory 64 attributes of the current transformers which the user intends to use with the monitor.

Figure 8:
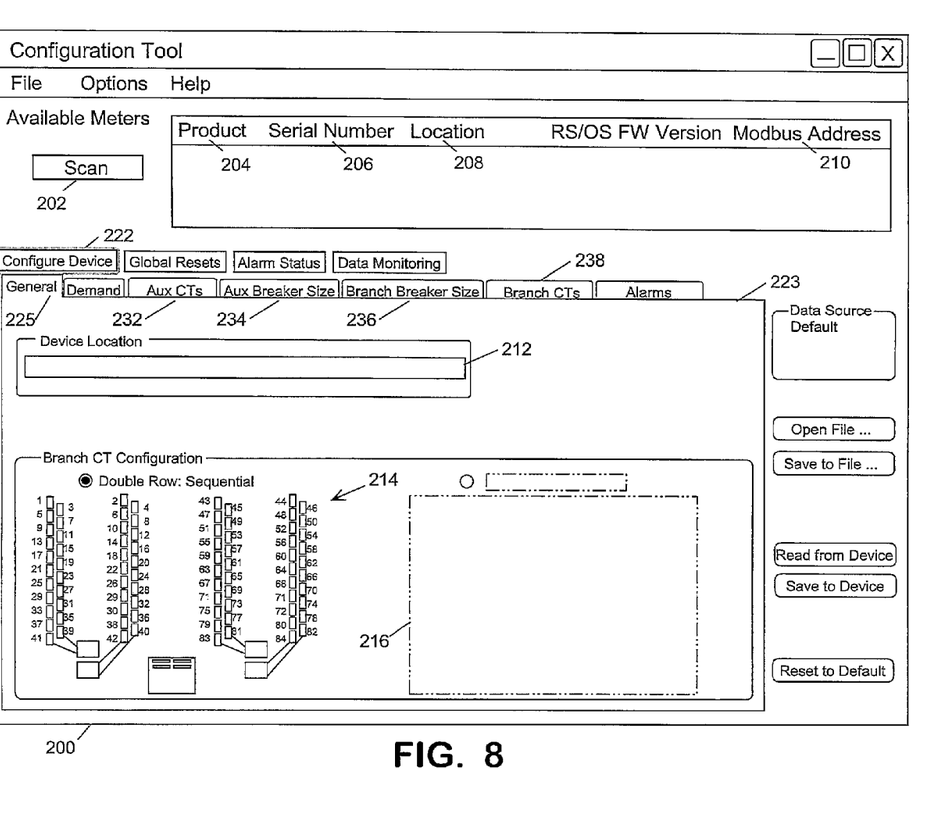
FIG. 8 is a pictorial representation of a main template for a branch circuit monitor configuration tool.

Referring to FIG. 8, an initial template 200 of the configuration tool comprises an interface enabling specification of general characteristics of the branch circuit monitor and its relationship to a larger data processing network, such as a building management system. The data processing unit 52 of the exemplary branch circuit monitor 40 can communicate with another data processing network utilizing the MODBUS® protocol. Each device in a network utilizing the MODBUS protocol must have a unique address. By selecting a scan button 202 on the template, the configuration tool can identify other devices making up a larger system by the device's product name 204, serial number 206, location 208 and MODBUS address 210. The initial template includes a plurality of user selectable buttons, including a configure device button 222, which, when selected, displays a tabbed file 223 to facilitate the specification of various attributes of the branch circuit monitor. When the general tab 225 of the initial template is selected, the installer can enter a general description of the branch circuit monitor that is being configured. Each distribution panel has a location identifier 212 which is used in reporting the operation of the branch circuit monitor and which can be entered from the template. The template also includes one or more icons 214, 216 representing possible arrangements for connecting the plurality of sets of branch current transformers that can supported by the monitor enabling the installer to easily select and specify the arrangement of the current transducers for a particular monitor.

Figure 9:
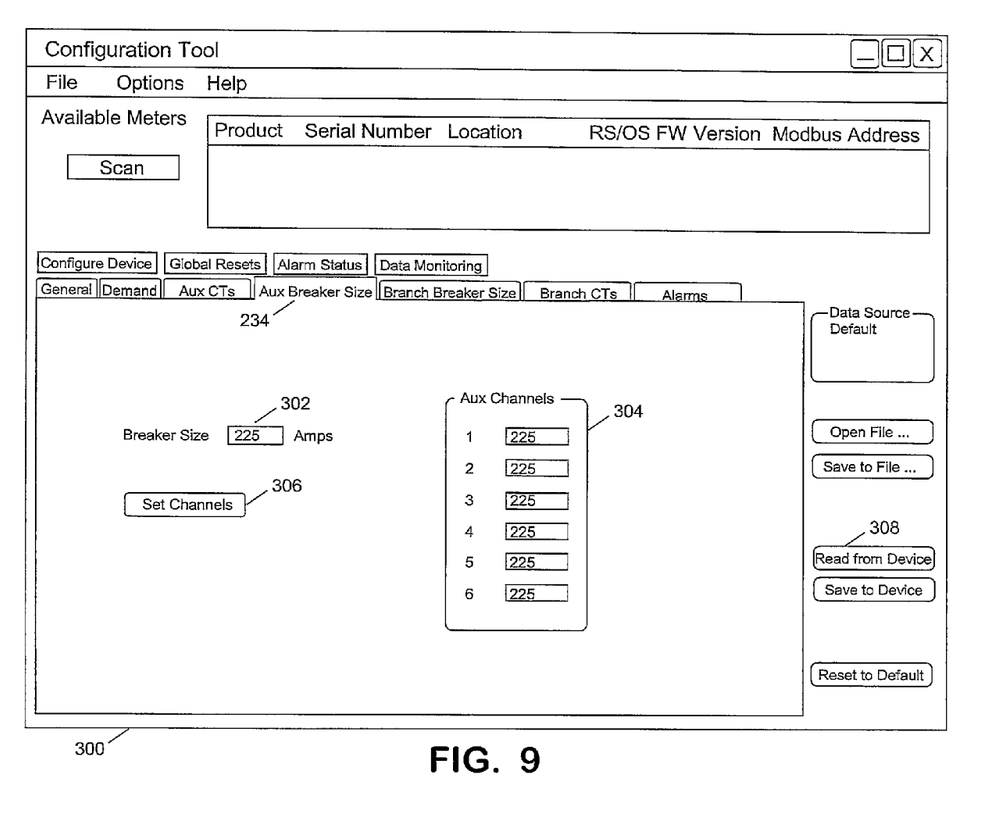
FIG. 9 is a pictorial representation of an auxiliary breaker specification template for a branch circuit monitor configuration tool.

Referring to also FIG. 9, selecting the AUX Breaker Size tab 234 on the initial display 200 displays a template 300 enabling specification of the size of a plurality of auxiliary circuit breakers, typically the mains circuit breakers. A typical mains circuit breaker is rated at 225 amps and the configuration tool suggests this size for the mains circuit breakers of the panel. If all the auxiliary circuit breakers have the same current rating the installer can enter the single rating 302 or if the auxiliary circuit breakers have different ratings, for example if one is not used, each auxiliary circuit breaker's rating can be specified separately 304. Clicking a SET CHANNELS button 306 saves the selected values. On the other hand, if the ratings of the auxiliary circuit breakers are already stored in the branch circuit monitor, selecting a button 308 in the template causes the monitor's data processing system to be queried and to load the ratings into the configuration tool.

Figure 10:
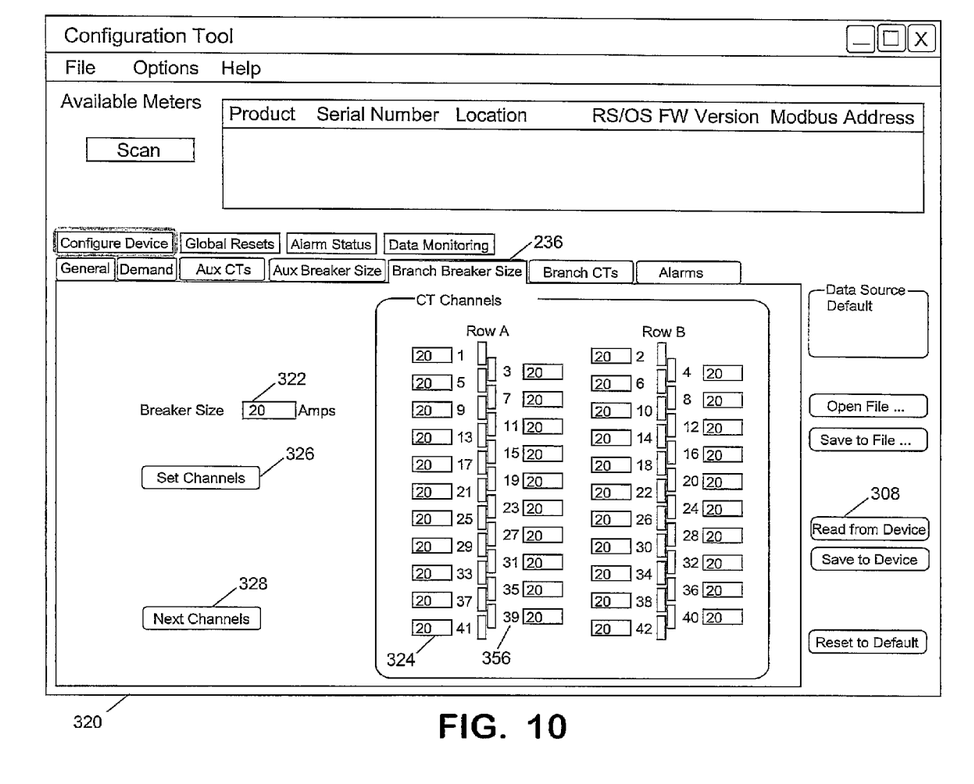
FIG. 10 is a pictorial representation of a branch breaker specification template for a branch circuit monitor configuration tool.

Referring to also FIG. 10, selecting the Branch Breaker Size tab 236 on the initial display 200 produces a template 320 enabling specification of the current ratings of the branch circuit breakers. If the branch circuit breakers have a common rating, the common rating can be entered 322 or, if various breakers have different ratings or are not used, the rating can be entered for specific circuit breaker 324. The template suggests a default value for the circuit breaker current rating that is common for branch circuit breakers. If the ratings of the branch circuit breakers are already stored in the branch circuit monitor's memory, the template enables querying the monitor's data processing system to upload the ratings to the configuration tool by selecting a button 308 on the template. When the size(s) of the branch circuit breakers have been specified, the sizes can be stored in the branch circuit monitor's memory by activating a SET CHANNELS button 326. If the monitor is monitoring additional branch circuits, activation of a NEXT CHANNELS button 328 will display the additional channels, for example, channels 43-82.

Figure 11:
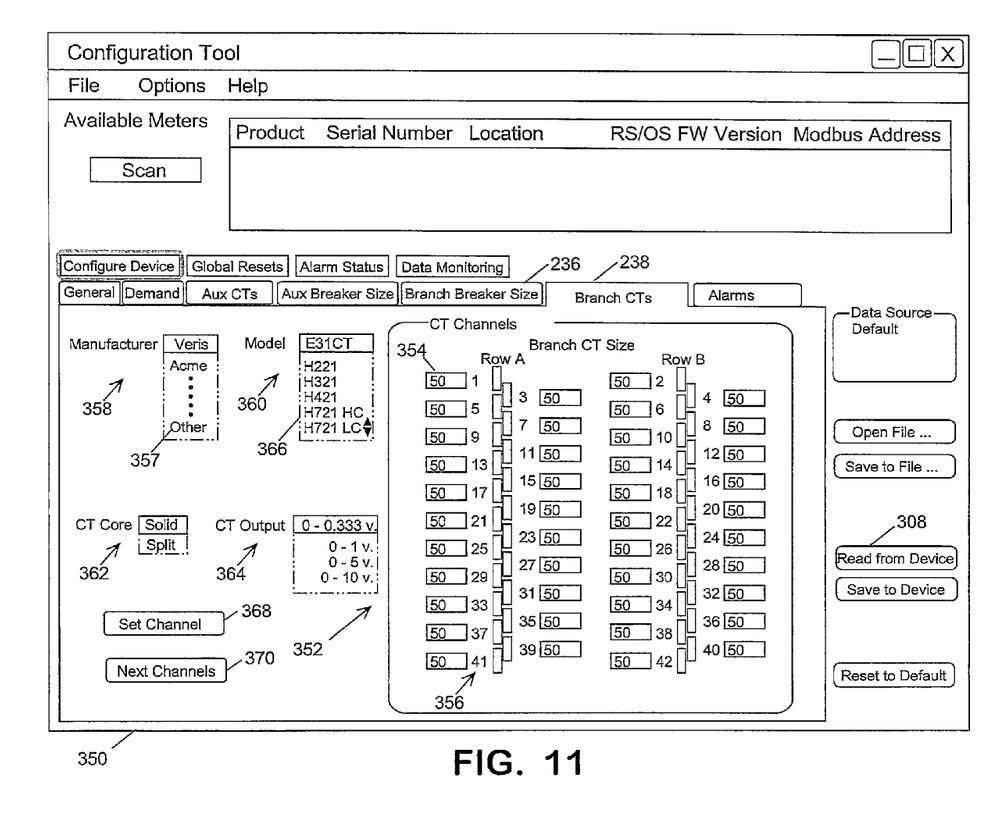
FIG. 11 is a pictorial representation of a branch current transformer specification template for a branch circuit monitor configuration tool.

Referring to also FIG. 11, selecting the branch current transformer (Branch CTs) tab 238 of the configuration tool produces a template 350 enabling the user to specify the branch current transformers to be used with the branch circuit monitor. The template includes a representation 352 of the arrangement of the current transformer channels of the branch circuit monitor. Initially, the template displays the current rating (size) 354, manufacturer 358, model 360, core type 362 and the transformer output 364 of the recommended current transformer. However, the installer can select one or more current transformer channels 356 and change the specifications of the current transformer to be used with that channel or group of channels. When a channel is selected, pull-down menus, for example, pull-down menu 366, are enabled which display additional current transformer manufacturers, models, and core types stored in the monitor's memory for the size of current transformer specified for the selected channel. The template enables the user to selectively specify the current transformer to be used with each branch circuit that is to be monitored. Relevant specifications 95 and error correction factors 97 for correcting phase and ratio errors are stored in the non-volatile memory of the meter for each of the current transformers displayable with the configuration tool. In addition, the configuration tool enables specifications and error factors for additional current transformers to be downloaded from a remote computer 75 for storage in the monitor's memory. Intermediate or typical error correction factors for OTHER current transformers 357 of various sizes may also be stored in the branch circuit monitor's memory for use with current transformers other than those having their particular specifications stored in the memory. When the installer has specified the current transformer(s) to be used with the selected channel(s), a SET CHANNEL button 368 on the configuration tool template, causes the data processing unit to identify in the memory the appropriate specifications, including the appropriate error correction factors, to be used in calculating and displaying the current and other parameters related to the branch circuit(s) corresponding to the selected current transformer channel(s). A NEXT CHANNELS button 370 displays additional current transformer channels that may be included in the monitor, for example, channels 43-82.

Figure 12:
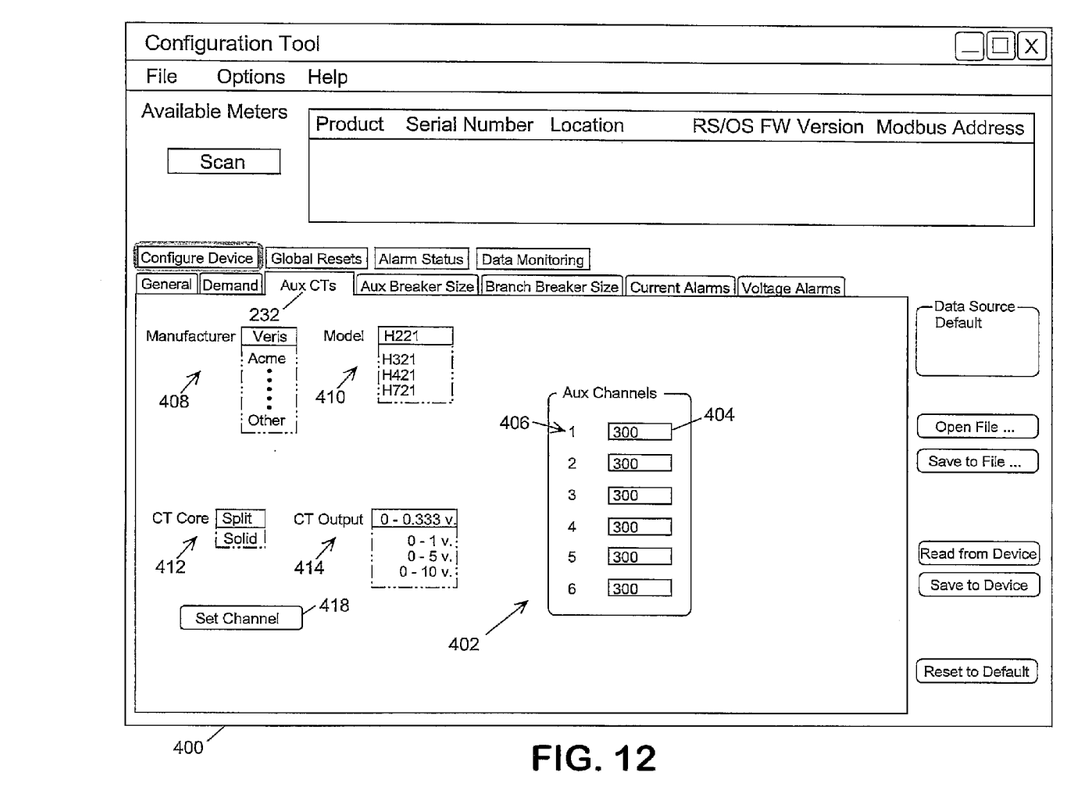
FIG. 12 is a pictorial representation of an auxiliary current transformer specification template for a branch circuit monitor configuration tool.

Referring to also FIG. 12, selecting the AUX CTs tab 232 produces a template 400 enabling the user to specify auxiliary current transformers used with the branch circuit monitor. Auxiliary current transformers are typically used to monitor the current in the mains. In a manner similar to the specification the branch current transformers, the installer can select individual auxiliary current transformer channels 406 and specify the size 404 of the auxiliary current transformer(s). The configuration tool causes the template to display the manufacturer 408, model 410, core type 412 and current transformer output 414 for various current transformers of the desired size 404 which have specifications, including error correction factors, stored in the monitor's memory. When the installer has specified the auxiliary current transformer(s) that are used with the selected channel(s), activating the SET CHANNEL button 418 causes the data processing unit to identify the appropriate error correction factors stored in the memory 64 which will be used in determining the current sensed by the respective auxiliary current transformer.

The configuration tool simplifies the configuration of the branch circuit monitor by providing templates for entry of current transformer characteristics and enables customization the monitor for improved accuracy with a variety of available current transformers.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

I claim:

1. A branch circuit monitor including a current transformer, said branch circuit monitor comprising:
   (a) a memory storing a manufacturer's identity for each of a plurality of transformers and a plurality of correction factors, each correction factor useful for adjusting an output of at least one current transformer for a transformer induced error, said plurality of correction factors enabling adjustment of a respective output of each of said plurality of current transformers having an identity stored in said memory; and
   (b) a data processing unit executing an instruction enabling selection of one of said plurality of current transformers having an identity stored in said memory by specifying one of said manufacturer's identities stored in said memory and executing a second instruction applying at least one stored correction factor appropriate for said selected current transformer to an output of said current transformer included in said branch circuit monitor;
   (c) said data processing unit receiving an additional identity and storing said additional identity in said memory for an additional current transformer not included within any of said plurality of current transformers, and said data processing unit executing said instruction enabling selection of said additional identity for said additional current transformer stored in said memory by specifying one of said manufacturer's identities stored in said memory and executing another instruction applying at least one stored correction factor appropriate for said additional transformer to an output of said additional transformer included in said branch circuit monitor.

2. The branch circuit monitor of claim 1 wherein said correction factor adjusts a current transformer output for a phase error.

3. The branch circuit monitor of claim 1 wherein said correction factor adjusts a current transformer output for a ratio error.

4. The branch circuit monitor of claim 1 wherein execution of said instruction enabling selection of one of said plurality of current transformers enables selection of a size of said selected current transformer.

5. The branch circuit monitor of claim 1 wherein execution of said instruction enabling selection of one of said plurality of current transformers enables selection of a construction of a core of said selected current transformer.

6. The branch circuit monitor of claim 1 wherein execution of said instruction enabling selection of one of said plurality of current transformers enables identification of said selected current transformer by selecting a model number of said selected current transformer.

7. A method of calibrating a branch circuit monitor including a current transformer, said method comprising the steps of:
   (a) storing an identity of a manufacturer of each of a plurality of current transformers in a memory of said branch circuit monitor;
   (b) storing a plurality of correction factors in said memory, each correction factor useful for adjusting an output of at least one current transformer for a transformer induced error, adjustment of an output of each of said plurality of current transformers having an identity stored in said memory enabled by at least one of said plurality of stored correction factors;
   (c) executing a data processing instruction enabling selection of one of said plurality of current transformers having a stored identity by specifying said identity of said manufacturer of said current transformer; and
   (d) executing another data processing instruction applying at least one stored correction factor appropriate for said selected current transformer to an output of said current transformer included in said branch circuit monitor;
   (e) receiving an additional identity and storing said additional identity in said memory for an additional current transformer not included within any of said plurality of current transformers;
   (f) executing said data processing instruction enabling selection of said additional identity for said additional current transformer stored in said memory by specifying one of said manufacturer's identities stored in said memory;
   (g) executing another instruction applying at least one stored correction factor appropriate for said additional transformer to an output of said additional transformer included in said branch circuit monitor.

8. The method of calibrating a branch circuit monitor of claim 7 wherein at least one correction factor adjusts a current transformer output for a phase error.

9. The method of calibrating a branch circuit monitor of claim 7 wherein at least one correction factor adjusts a current transformer output for a ratio error.

10. The method of calibrating a branch circuit monitor of claim 7 wherein the step of executing said data processing instruction enabling selection of one of said plurality of current transformers having a stored identity enables selection of a size of said selected current transformer.

11. The method of calibrating a branch circuit monitor of claim 7 wherein the step of executing said instruction enabling selection of one of said plurality of current transformers having a stored identity enables selection of a construction of a core of said selected current transformer.

12. The method of calibrating a branch circuit monitor of claim 7 wherein the step of executing said data processing instruction enabling selection of one of said plurality of current transformers having a stored identity enables identification of said selected current transformer by selecting a model number of said selected current transformer.

* * * * *